United States Patent
Suter et al.

(10) Patent No.: US 9,059,832 B2
(45) Date of Patent: Jun. 16, 2015

(54) RANK DEFICIENT DECODING OF LINEAR NETWORK CODING

(71) Applicant: The United States of America as Represented by the Secretary of the Air Force, Washington, DC (US)

(72) Inventors: Bruce W. Suter, Whitesboro, NY (US); Zhiyuan Yan, Easton, PA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 163 days.

(21) Appl. No.: 13/949,319

(22) Filed: Jul. 24, 2013

(65) Prior Publication Data

US 2014/0036657 A1    Feb. 6, 2014

Related U.S. Application Data

(60) Provisional application No. 61/742,058, filed on Aug. 1, 2012.

(51) Int. Cl.
H04L 12/26    (2006.01)
H04L 1/00    (2006.01)
H03M 13/37    (2006.01)

(52) U.S. Cl.
CPC ......... *H04L 1/0076* (2013.01); *H03M 13/3761* (2013.01)

(58) Field of Classification Search
None
See application file for complete search history.

(56) References Cited

U.S. PATENT DOCUMENTS

| | | | |
|---|---|---|---|
| 2003/0050719 A1* | 3/2003 | Bao-Liang et al. | 700/91 |
| 2007/0010989 A1* | 1/2007 | Faruquie et al. | 704/2 |
| 2008/0144562 A1* | 6/2008 | Draper et al. | 370/315 |
| 2011/0041033 A1* | 2/2011 | Yedidia et al. | 714/752 |
| 2012/0069928 A1* | 3/2012 | Jose et al. | 375/285 |
| 2013/0262661 A1* | 10/2013 | Malboubi et al. | 709/224 |
| 2014/0146924 A1* | 5/2014 | Shattil | 375/340 |

* cited by examiner

*Primary Examiner* — Otis L Thompson, Jr.
(74) *Attorney, Agent, or Firm* — Joseph A Mancini

(57) ABSTRACT

Rank deficient decoding for linear network coding. The decoding problem is first decomposed into multiple parallel sub-problems. A determination is made whether the decoding problem is or is not rank deficient. If rank deficient, and for each sub-problem, a rank deficient decoder is applied to obtain a solution.

2 Claims, 2 Drawing Sheets

RANK DEFICIENT DECODING OF LINEAR NETWORK CODING

PRIORITY CLAIM UNDER 35 U.S.C. §119(e)

This patent application claims the priority benefit of the filing date of provisional application Ser. No. 61/742,058, having been filed in the United States Patent and Trademark Office on Aug. 1, 2012 and now incorporated by reference herein.

STATEMENT OF GOVERNMENT INTEREST

The invention described herein may be manufactured and used by or for the Government of the United States of America for governmental purposes without the payment of any royalty thereon.

BACKGROUND OF THE INVENTION

1. Technical Field of the Invention

This invention relates generally to the field of communication networks. More specifically the present invention relates to rank deficient decoding of linear network coding.

2. Background

Communications networks (CNs) are ubiquitous in our everyday life as well as our national infrastructure. Network coding [1] has the potential to fundamentally transform current and future CNs due to the promise of significant throughput gains. Furthermore, network coding has other advantages such as robustness and can be implemented in a distributed manner with random linear network coding[2]. Hence, network coding is already used or considered for a wide variety of wired and wireless networks.

One significant drawback of network coding is its all-or-nothing property in more than one sense. First, a full rank of received packets at the receiver nodes is needed before decoding can start, leading to long delays and low throughputs, especially when the number of packets of a session is large. This is particularly undesirable for military and civil applications with stringent delay requirements. Second, all the bits in any packet are "created equal" in the sense that they are recovered simultaneously.

Network coding is a network paradigm where packets can be operated on or mixed. It has been shown that network coding improves the network throughput and robustness to network failures. Although network coding is first applied to packets, this idea has later been applied to waveforms on the physical layer.

It has been shown that in most practical scenarios, linear network coding is close to optimal. Furthermore, in all existing linear network coding schemes, a full rank decoder is used. A full rank decoder fails unless the rank of the received packets is the same as that of the transmitted packets.

3. The Prior Art

U.S. Pat. No. 8,473,998 to Lucani et al. discloses a method, apparatus and computer program product for utilizing network coding for multi-resolution multicast. A network source partitions source content into a base layer and one or more refinement layers. The network source receives a respective one or more push-back messages from one or more network destination receivers, the push-back messages identifying the one or more refinement layers suited for each one of the one or more network destination receivers. The network source computes a network code involving the base layer and the one or more refinement layers for at least one of the one or more network destination receivers, and transmits the network code to the one or more network destination receivers in accordance with the push-back messages.

U.S. Pat. No. 8,046,426 to Medard et al. discloses a method and computer program product for providing a random linear coding approach to distributed data storage is presented. A file is broken into a plurality of pieces. For every peer (peer means storage-location with limited storage space), the number of coded-pieces the peer can store is determined. Each of the coded-piece is determined by taking random linear combination of all the pieces of the entire file. The associate code-vector is stored for every coded-piece. The file is retrieved by collecting code-vectors and the coded-pieces from the peers and viewing the collected code-vectors as a matrix. When a dimension of the matrix is equal to the number of pieces of the file, the file is recovered using the collection of code vectors in the matrix.

U.S. Pat. No. 8,375,102 to Medard et al. discloses a method and computer program product for providing a random linear coding approach to distributed data storage is presented. A file is broken into a plurality of pieces. For every peer (peer means storage-location with limited storage space), the number of coded-pieces the peer can store is determined. Each of the coded-piece is determined by taking random linear combination of all the pieces of the entire file. The associate code-vector is stored for every coded-piece. The file is retrieved by collecting code-vectors and the coded-pieces from the peers and viewing the collected code-vectors as a matrix. When a dimension of the matrix is equal to the number of pieces of the file, the file is recovered using the collection of code vectors in the matrix.

U.S. Pat. No. 8,102,837 to Deb et al. discloses a method, apparatus and computer program product for providing rapid information dissemination using network coding is presented. A coded message including a payload and a code vector, is transmitted from a first node of the network to a second node of the network. The information thus stored can also be retrieved by collecting code vectors from at least one node and viewing the collected code vectors as a matrix. A determination is made regarding whether a dimension of the matrix is equal to a predefined number. When the dimension of the matrix equals the predefined number, the information is retrieved using the collection of code vectors in the matrix.

All network coding schemes in the prior art assume a full rank decoder. Hence, more received packets are needed before decoding starts.

OBJECTS AND SUMMARY OF THE INVENTION

The present invention provides an apparatus and method for rank deficient decoding of linear network coding in a communications network.

It is therefore an object of the present invention to provide a decoding apparatus and method for linear network coding that works even when the received packets are rank deficient.

Briefly stated, the present invention achieves these and other objects by providing a decoding method when the received packets are rank deficient.

In a fundamental embodiment of the present invention, packets in a communications network are transmitted in batches. In linear network coding, any communications network node performs linear operations on any packets received for a particular batch. Hence, at the destination, a set of packets is received corresponding to the batch of transmitted packets. The full rank decoder starts only when the rank of the received packets is the same as the rank of the transmitted packets.

The above and other objects, features and advantages of the present invention will become apparent from the following description read in conjunction with the accompanying drawings, in which like reference numerals designate the same elements.

References

[1] R. Ahlswede, N. Cai, S. Li, and R. Young, "Network information flow," *IEEE Transactions on Information Theory*, Vol. 46, pp. 1204-1216, July 2000.

[2] T. Ho, M. Medard, R. Kotter, M. Effros, J. Shi, and B. Leong, "A Random Linear Network Coding Approach to Multicast," *IEEE Transactions on Information Theory*, Vol. 52, pp. 4413-4430, October 2006.

DETAILED DESCRIPTION OF THE PREFERRED EMBODIMENT

In a fundamental embodiment of the present invention, packets are transmitted in batches. In linear network coding, any network node performs linear operations on any packets received for a particular batch. Hence, at the destination, a set of packets is received corresponding to the batch of transmitted packets. The full rank decoder starts only when the rank of the received packets is the same as the rank of the transmitted packets.

Figure 1:
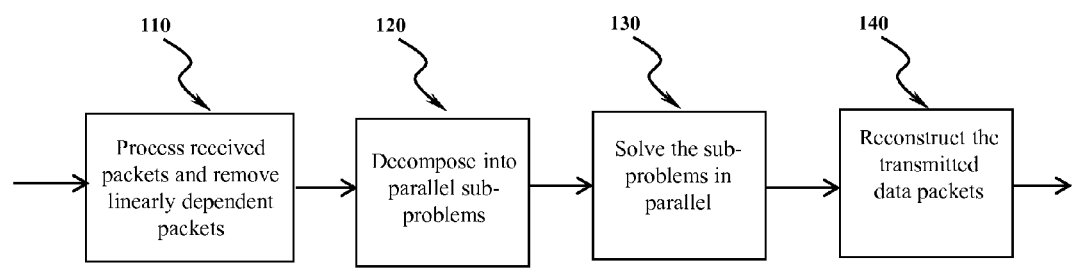
FIG. 1 depicts a high level process diagram of the present invention.

This invention reconstructs the transmitted packets from a set of received packets even if the received packets are rank deficient. Referring to FIG. 1, the received packets are first processed 110 in order to remove linearly dependent packets. Then the decoding problem is decomposed 120 into multiple parallel sub-problems. After solving 130 the sub-problems in parallel, the solutions to the sub-problems are used to reconstruct 140 the transmitted data packets.

Each received packet has two parts relevant to linear network coding: the first, called the header, contains the linear coefficients used to obtain the received packet, and the second is the data. Note that the data is the linear combination of the transmitted data packets using the coefficients in the header.

Suppose packet i is treated as two row vectors $h_i$ and $d_i$, where $h_i$ is the header and $d_i$ the data. The received packets are hence represented by [H D], where row i of H and D are $h_i$ and $d_i$, respectively. Gaussian elimination is applied to [H D], and the result is a two-by-two block matrix $$\begin{bmatrix} A & V \\ 0 & 0 \end{bmatrix},$$

where 0's are zero matrices and A and V have n rows. If n is the same as m, the number of transmitted data packets, then the full rank decoder shown in FIG. 1 can be used to obtain the transmitted data packets.

Figure 2:
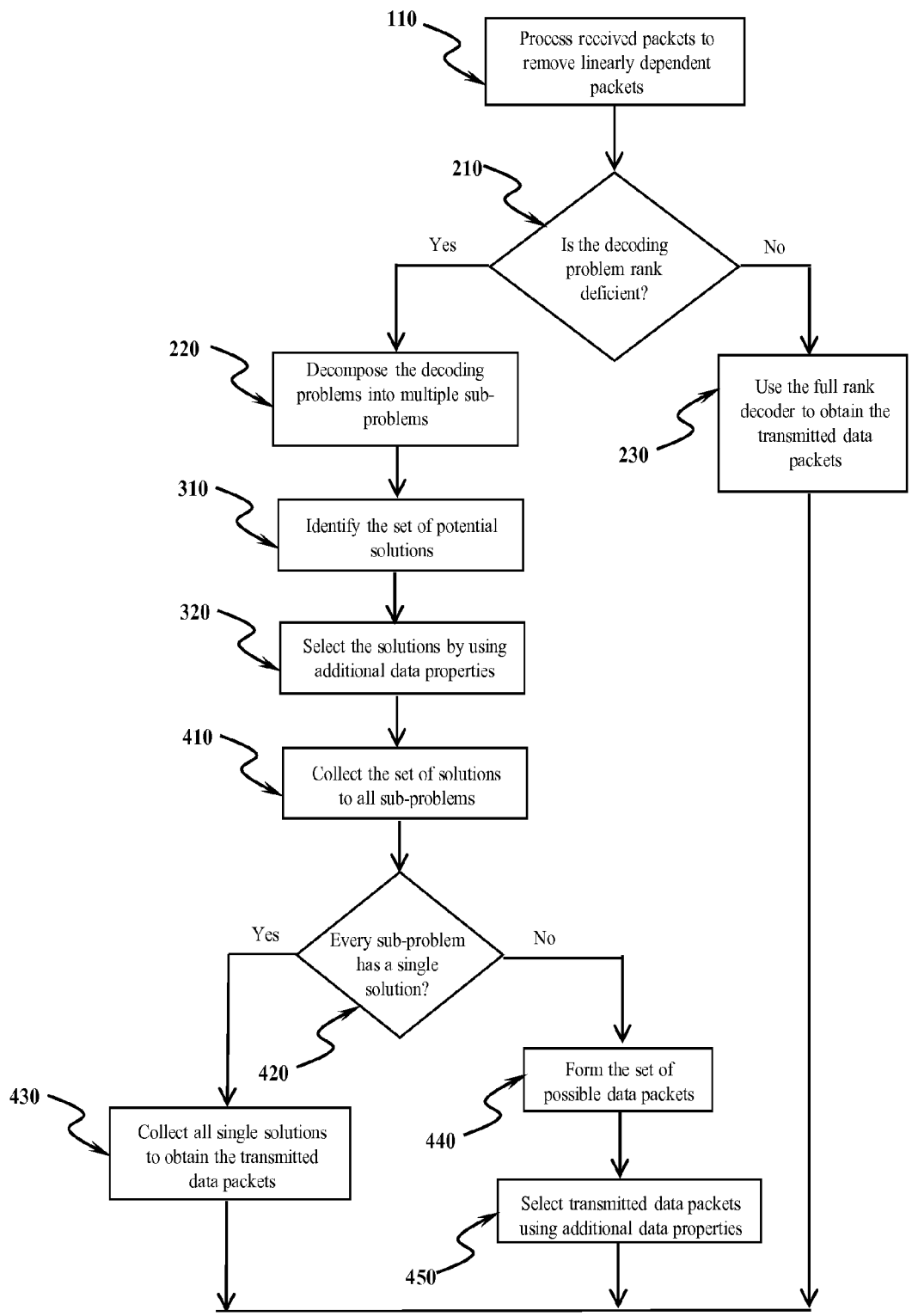
FIG. 2 depicts the detailed process for how received packets are decoded.

Referring now to FIG. 2, suppose the lengths of the transmitted data packets are N. If n<m, then the present invention makes the determination 210 whether the decoding problem is "rank deficient". If it is determined that the decoding problem is not rank deficient 230, then a full rank decoding process is employed as depicted in FIG. 1. Otherwise, if determined rank deficient, the present invention will commence with decompose the decoding into multiple sub-problems. 220 As such, the decoding problem is now decomposed into N parallel sub-problems: $AW_i=V_i$ for i=0, 1, ..., N−1, where $V_i$ is the i-th column of V. Here A and $V_i$ are known, and we need to solve for $W_i$.

The N sub-problems are then solved in parallel. Since n<m, this is essentially an underdetermined linear equation. For each sub-problem, first the present invention identifies 310 a set of possible solutions. The invention will use further property of data to pick the solution. For instance, if it is known that the data packets are sparse, then the solution(s) with a certain number of nonzero entries will be selected 320.

After all N sub-problems are solved, the solutions to all sub-problems are collected 410. Next, the invention determines 420 whether every sub-problem has a single solution. If yes, then $W_i$'s have been obtained from the sub-problems, and they are collected 430 to form the transmitted data packets as shown in FIG. 2. That is, the transmitted data packets are the rows of $[W_0\ W_1\ ...\ W_{N-1}]$. If no, it means that multiple candidates exist for $[W_0\ W_1\ ...\ W_{N-1}]$. The invention first forms 440 the set of possible data packets, and then selects 450 the transmitted data packets using additional data packets. For instance, if the number of bits being one in each data packet is limited, then this limit can be used to select the transmitted data packet.

The present invention is most readily implemented in computer software instructions being executed on a computer that has inputs and outputs to and from a communications network. Inputs to the invention are received data packets. Outputs from the invention are reconstructed data packets.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. In a communications network, a decoder for decoding received rank deficient packets, comprising:
   computer; and
   a software program, wherein
   said computer further comprises means to communicate input and output packet data with said communications system; and wherein
   said software program further comprises a set of computer-implementable instructions stored on a non-transitory media, which, when executed by said computer cause said computer to perform the following steps:
   processing received packets to remove linearly dependent packets;
   decomposing into parallel sub-problems, wherein said step of decomposing further causes said computer to perform the steps of:
   determining whether the decoding problem is rank deficient;
   decomposing the decoding problem into N sub-problems when the decoding problem is rank deficient; and
   using a full rank decoder to obtain transmitted data packets when the decoding problem is not rank deficient.
   solving the sub-problems in parallel, wherein said step of solving sub-problems in parallel further causes said computer to perform the steps of:
   identifying a set of potential solutions;

selecting solutions by using additional data properties; and collecting a set of solutions to all said sub-problems; and reconstructing transmitted data packets. wherein said step of reconstructing transmitted data packets further causes said computer to perform the following steps of;

determining whether all sub-problems have unique solutions;

collecting all unique solutions to obtain said transmitted data packets when all said sub-problems have unique solutions; and forming a set of possible data packets and then select transmitted data packets using additional data properties when all said sub-problems do not have unique solutions.

2. In a communications network, a method for decoding received rank deficient packets, comprising the steps of:

processing received packets to remove linearly dependent packets;

decomposing into parallel sub-problems, wherein said step of decomposing further comprises the steps of:

determining whether the decoding problem is rank deficient;

decomposing the decoding problem into N sub-problems when the decoding problem is rank deficient; and using a full rank decoder to obtain transmitted data packets when the decoding problem is not rank deficient;

solving the sub-problems in parallel, wherein said step of solving sub-problems in parallel further comprises the steps of:

identifying a set of potential solutions;

selecting solutions by using additional data properties; and collecting a set of solutions to all said sub-problems; and reconstructing transmitted data packets; wherein said step of reconstructing transmitted data packets further comprises the steps of:

determining whether all sub-problems have unique solutions;

collecting all unique solutions to obtain said transmitted data packets when all said sub-problems have unique solutions; and forming a set of possible data packets and then select transmitted data packets using additional data properties when all said sub-problems do not have unique solutions.

* * * * *